United States Patent
Lee et al.

(10) Patent No.: US 10,170,172 B2
(45) Date of Patent: Jan. 1, 2019

(54) LOGIC CIRCUITS INCLUDING MAGNETIC TUNNEL JUNCTION DEVICES

(71) Applicants: Kyung Min Lee, Seoul (KR); Hyunsung Jung, Hwaseong-si (KR)

(72) Inventors: Kyung Min Lee, Seoul (KR); Hyunsung Jung, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 26 days.

(21) Appl. No.: 15/491,289

(22) Filed: Apr. 19, 2017

(65) Prior Publication Data
US 2018/0122445 A1    May 3, 2018

(30) Foreign Application Priority Data
Nov. 1, 2016  (KR) .................. 10-2016-0144484

(51) Int. Cl.
| | |
|---|---|
| *G11C 11/00* | (2006.01) |
| *G11C 11/16* | (2006.01) |
| *H01L 27/22* | (2006.01) |
| *H01L 29/78* | (2006.01) |
| *H01L 43/02* | (2006.01) |
| *H01L 43/08* | (2006.01) |
| *H03K 19/18* | (2006.01) |

(52) U.S. Cl.
CPC .......... *G11C 11/165* (2013.01); *G11C 11/161* (2013.01); *H01L 27/228* (2013.01); *H01L 29/7851* (2013.01); *H01L 43/02* (2013.01); *H01L 43/08* (2013.01); *H03K 19/18* (2013.01)

(58) Field of Classification Search
CPC ... G11C 11/165; G11C 11/161; H01L 27/228; H01L 29/7851

USPC ......... 365/158, 171, 66; 326/37, 38, 39, 104
See application file for complete search history.

(56) References Cited

U.S. PATENT DOCUMENTS

| | | | |
|---|---|---|---|
| 7,439,770 B2 | 10/2008 | Kim et al. | |
| 8,040,154 B2 | 10/2011 | Chua-Eoan et al. | |
| 8,295,082 B2 * | 10/2012 | Chua-Eoan | G11C 11/16 |
| | | | 326/39 |
| 8,354,861 B2 | 1/2013 | Sugibayashi et al. | |

(Continued)

FOREIGN PATENT DOCUMENTS

| | | |
|---|---|---|
| KR | 100814108 B1 | 3/2008 |
| KR | 100961723 B1 | 6/2010 |

*Primary Examiner* — Connie Yoha
(74) *Attorney, Agent, or Firm* — Harness, Dickey & Pierce, P.L.C.

(57) ABSTRACT

A logic circuit may include at least one magnetic tunnel junction device including a first layer configured to receive a particular input signal and a second layer connected to a node, and an inverter connected to the node and configured to generate an output signal by inverting a signal of the node, wherein the inverter includes a transistor on a substrate, and the at least one magnetic tunnel junction device is on an upper portion of the transistor. The at least one magnetic tunnel junction device may include first and second magnetic tunnel junction devices configured to receive first and second input signals, respectively. The logic circuit may include a magnetic tunnel junction device and a reference resistor configured to receive a second input signal, the reference resistor connected to the node, the reference resistor having a reference resistance. The logic circuit may be included in an apparatus.

6 Claims, 11 Drawing Sheets

(56) References Cited

U.S. PATENT DOCUMENTS

| | | | |
|---|---|---|---|
| 8,373,438 B2* | 2/2013 | Shukh | H03K 19/16 |
| | | | 326/104 |
| 9,100,013 B2 | 8/2015 | Nebashi et al. | |
| 9,628,078 B2* | 4/2017 | Park | H03K 19/01742 |
| 9,666,259 B1* | 5/2017 | Jung | G11C 11/1673 |
| 2014/0355330 A1 | 12/2014 | Endoh et al. | |
| 2015/0138877 A1 | 5/2015 | Nebashi et al. | |
| 2016/0020766 A1 | 1/2016 | Miao et al. | |
| 2016/0172036 A1* | 6/2016 | Augustine | G11C 14/0081 |
| | | | 365/66 |

* cited by examiner

LOGIC CIRCUITS INCLUDING MAGNETIC TUNNEL JUNCTION DEVICES

CROSS-REFERENCE TO RELATED APPLICATION

This application claims the benefit, under 35 U.S.C. § 119, of Korean Patent Application No. 10-2016-0144484, filed on Nov. 1, 2016, in the Korean Intellectual Property Office, the disclosure of which is incorporated herein in its entirety by reference.

BACKGROUND

The inventive concepts relate to logic circuits, and more particularly, to logic circuits including magnetic tunnel junction devices.

According to the tremendous development of the electronics industry and users' demand, electronic devices have become smaller, can perform multiple functions, and have higher capacity. Accordingly, high-capacity data processing in a small area may be desired.

Recently, a new exposure technology or a high-cost process technology is used in pattern refining of a highly integrated device, and thus, much research has been done on a new integration density technology. For example, magnetic tunnel junction devices may satisfy high integration requirements, and thus, active research has been done on such devices.

SUMMARY

The inventive concepts provide a logic circuit including a magnetic tunnel junction device with increased integration density and reduced process cost.

According to some example embodiments, a logic circuit may include: an inverter connected to a node, the inverter configured to generate an output signal based on inverting a signal of the node, the inverter including a transistor on a substrate; a first magnetic tunnel junction device on an upper portion of the transistor, the first magnetic tunnel junction device including a first layer configured to receive a first input signal and a second layer connected to the node; and a second magnetic tunnel junction device on the upper portion of the transistor, the second magnetic tunnel junction device including a first layer configured to receive a second input signal and a second layer connected to the node.

According to some example embodiments, a logic circuit may include: a magnetic tunnel junction device including a first layer configured to receive a first input signal and a second layer connected to a node; a reference resistor configured to receive a second input signal, the reference resistor connected to the node, the reference resistor having a reference resistance; and an inverter connected to the node, the inverter configured to generate an output signal based on inverting a signal of the node.

According to some example embodiments, an apparatus may include: a processor; and a memory, the memory including: a transistor on a substrate, the transistor configured to implement an inverter connected to a node, such that the transistor is configured to generate an output signal based on inverting a signal of the node; and at least one magnetic tunnel junction devices on an upper portion of the transistor such that the at least one magnetic tunnel junction device is connected to the node, the at least one magnetic tunnel junction device including a first layer that is distal from the transistor and a second layer that is proximate to the transistor.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
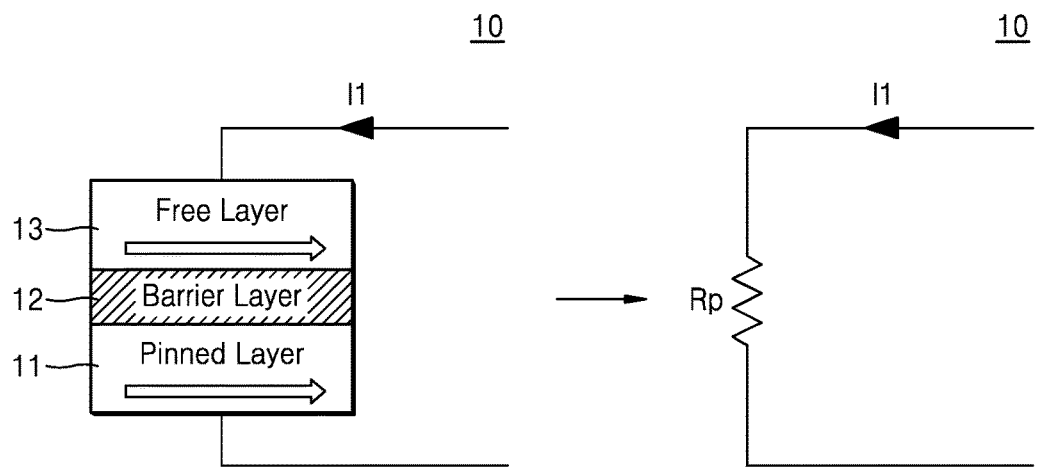
FIG. 1A and FIG. 1B are conceptual diagrams illustrating a change in resistance according to a magnetization direction of a magnetic tunnel junction device according to some example embodiments.

Hereinafter, example embodiments of the inventive concepts will be described in detail with reference to the accompanying drawings. Like reference numerals in the drawings denote like elements, and repeated descriptions thereof will be omitted herein.

Figure 1B:
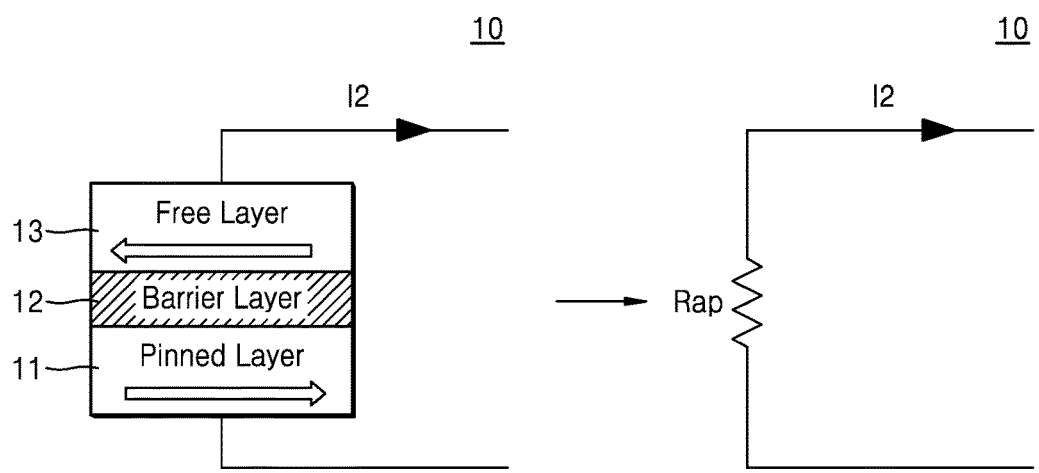

FIG. 1A and FIG. 1B are conceptual diagrams illustrating a change in resistance according to a magnetization direction of a magnetic tunnel junction device 10 according to some example embodiments.

Referring to FIGS. 1A and 1B, the magnetic tunnel junction device 10 may include a free layer 13, a pinned layer 11, and a barrier layer 12 therebetween. A magnetization direction of the pinned layer 11 may be fixed, and a magnetization direction of the free layer 13 may be the same as or opposite to the magnetization direction of the pinned layer 11 according to conditions.

The free layer 13 may include a material having a changeable magnetization direction. The magnetization direction of the free layer 13 may be changed by electric/magnetic factors provided from the outside and/or the inside of the magnetic tunnel junction device 10. The free layer 13 may include a ferromagnetic material including at least one selected from cobalt Fe, Co, Ni, Pd, and Pt. For example, the free layer 13 may include at least one selected from FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The barrier layer 12 may have a thickness less than a spin diffusion distance. The barrier layer 12 may include a non-magnetic material. For example, the barrier layer 12 may include at least one selected from an oxide of magnesium (Mg), titanium (Ti), aluminum (Al), magnesium-zinc (MgZn) and magnesium-boron (MgB), and a nitride of titanium (Ti) and vanadium (V). In another example, the barrier layer 12 may be a magnesium oxide (MgO) film. Alternatively, the barrier layer 12 may include a plurality of layers.

The pinned layer 11 may include a ferromagnetic material. For example, the pinned layer 11 may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In order to fix the magnetization direction of the pinned layer 11, an anti-ferromagnetic layer including an anti-ferromagnetic material may be further included. For example, the anti-ferromagnetic layer may include at least one selected from PtMn, IrMn, MnO, MnS, MnTe, $MnF_2$, $FeCl_2$, FeO, $CoCl_2$, CoO, $NiCl_2$, NiO, and Cr. However, the present disclosure is not limited thereto, and the pinned layer 11 may include a plurality of layers.

Referring to FIG. 1A, the magnetization direction of the free layer 13 may be determined according to a direction in which a current flows through the magnetic tunnel junction device 10. For example, when a first current I1 flowing from the free layer 13 to the pinned layer 11 is applied to the magnetic tunnel junction device 10, free electrons having the same spin direction as the pinned layer 11 apply a torque to the free layer 13. Thus, the free layer 13 may be magnetized to be parallel to the pinned layer 11, and the magnetic tunnel junction device 10 may have a parallel resistance Rp.

Referring to FIG. 1B, when a second current I2 flowing from the pinned layer 11 to the free layer 13 is applied to the magnetic tunnel junction device 10, electrons having opposite spin to the pinned layer 11 return to the free layer 13 and apply a torque thereto. Thus, the free layer 13 may be magnetized to be anti-parallel to the pinned layer 11, and the magnetic tunnel junction device 10 may have an anti-parallel resistance Rap. The anti-parallel resistance Rap may be greater than the parallel resistance Rp. That is, the magnetization direction of the free layer 13 in the magnetic tunnel junction device 10 may be changed by a spin transfer torque (STT).

Figure 2A:
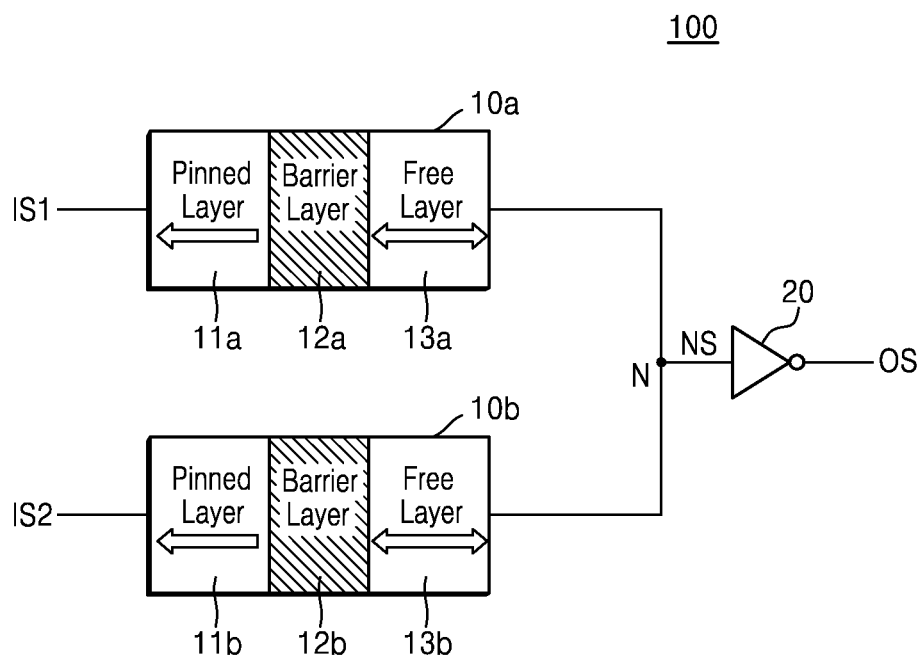
FIG. 2A is a conceptual diagram illustrating a logic circuit according to some example embodiments.
Figure 2B:
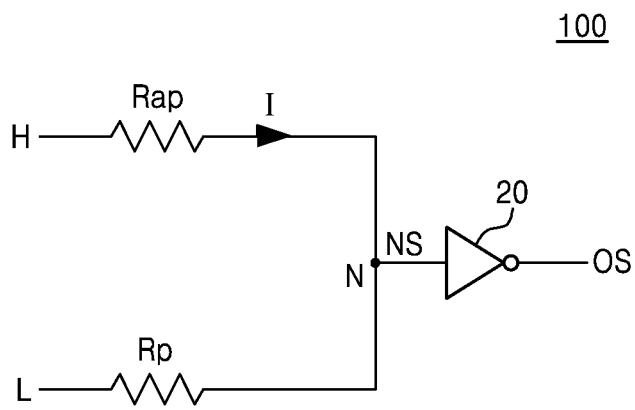
FIG. 2B is a conceptual diagram illustrating a resistance value that a magnetic tunnel junction device has when first and second input signals are respectively applied to first and second magnetic tunnel junction devices.

FIG. 2A is a conceptual diagram illustrating a logic circuit 100 according to some example embodiments. FIG. 2B is a conceptual diagram illustrating a resistance value that a magnetic tunnel junction device has when first and second input signals are respectively applied to first and second magnetic tunnel junction devices.

Referring to FIG. 2A, the logic circuit 100 may include a first magnetic tunnel junction device 10a, a second magnetic tunnel junction device 10b, and an inverter 20. The first magnetic tunnel junction device 10a may include a first free layer 13a, a first barrier layer 12a, and a first pinned layer 11a, and the second magnetic tunnel junction device 10b may include a second free layer 13b, a second barrier layer 12b, and a second pinned layer 11b.

The first magnetic tunnel junction device 10a and the second magnetic tunnel junction device 10b may be the magnetic tunnel junction device 10 of FIGS. 1A and 1B. Accordingly, the first magnetic tunnel junction device 10a may have a first parallel resistance and a first anti-parallel resistance according to a current flow, and the second magnetic tunnel junction device 10b may have a second parallel resistance and a second anti-parallel resistance according to a current flow. Values of the first parallel resistance and the second parallel resistance may be a value of the parallel resistance Rp of FIG. 1A and be substantially the same as each other, and values of the first anti-parallel resistance and the second anti-parallel resistance may be a value of the anti-parallel resistance Rap of FIG. 1B and be substantially the same as each other. However, the present disclosure is not limited thereto, and values of the first parallel resistance and the second parallel resistance may be different from each other, and values of the first anti-parallel resistance and the second anti-parallel resistance may be different from each other.

A first input signal IS1 may be transmitted to the first pinned layer 11a of the first magnetic tunnel junction device 10a, and a second input signal IS2 may be transmitted to the second pinned layer 11b of the second magnetic tunnel junction device 10b. The first free layer 13a, the second free layer 13b, and the inverter 20 may be connected to one another at a node N. The inverter 20 may receive a node signal NS from the node N and generate an output signal OS.

Each of the first input signal IS1 and the second input signal IS2 may have a first logic level L or a second logic level H. The logic level of an input signal may correspond to a magnitude of voltage of the input signal. The second logic level H may have a value greater than that of the first logic level L. For example, the first logic level L may be 0[V], and the second logic level H may have a value of $V_{DD}$[V] greater than 0[V]. However, the present disclosure is not limited thereto.

TABLE 1

| IS1 | IS2 | NS | OS |
|-----|-----|-----|-----|
| L | L | L | H |
| H | L | <L + 0.5*(H − L) | H |
| L | H | <L + 0.5*(H − L) | H |
| H | H | H | L |

As shown in Table 1, when both of the first input signal IS1 and the second input signal IS2 have the first logic level L, no current flows through the first magnetic tunnel junction device 10a and the second magnetic tunnel junction device 10b, and thus, the node signal NS transmitted from the node N to the inverter 20 may also have the same first logic level L as the first input signal IS1 and the second input signal IS2. Similarly, when both of the first input signal IS1 and the second input signal IS2 have the second logic level H, no current flows through the first magnetic tunnel junction device 10a and the second magnetic tunnel junction device 10b, and thus, the node signal NS may have the second logic level H.

On the other hand, referring to FIG. 2B, when the first input signal IS1 has the second logic level H, and the second input signal IS2 has the first logic level L, a current may flow from the first magnetic tunnel junction device 10a to the second magnetic tunnel junction device 10b due to a potential difference. That is, a current may flow from the first pinned layer 11a to the first free layer 13a, and a current may flow from the second free layer 13b to the second pinned layer 11b. Accordingly, as shown in FIG. 2B, the first magnetic tunnel junction device 10a may have a value of the anti-parallel resistance Rap, and the second magnetic tunnel junction device 10b may have a value of the parallel resistance Rp.

A value of the node signal NS is as defined in Equation 1 below.

$$NS = L + (H - L) \times \frac{R_p}{R_p + R_{ap}}$$ [Equation 1]

As described above with reference to FIGS. 1A and 1B, the anti-parallel resistance Rap has a value greater than that of the parallel resistance Rp, and accordingly, the node signal NS may have a value closer to the first logic level L than the second logic level H. When the node signal NS is included in a sensing margin of the first logic level L of the inverter 20, the output signal OS may have the second logic level H due to the inverter 20. The sensing margin of the inverter 20 will be described in detail later with reference to FIGS. 6A and 6B.

The node signal NS that may be present if and/or when the first input signal IS1 has the first logic level L and the second input signal IS2 has the second logic level H may have a common value (e.g., common voltage magnitude) as the node signal NS that may be present if and/or when the first input signal IS1 has the second logic level H, and the second input signal IS2 has the first logic level L. Accordingly, as in Table 1, the logic circuit 100 may be a NAND gate logic circuit.

Figure 3A:
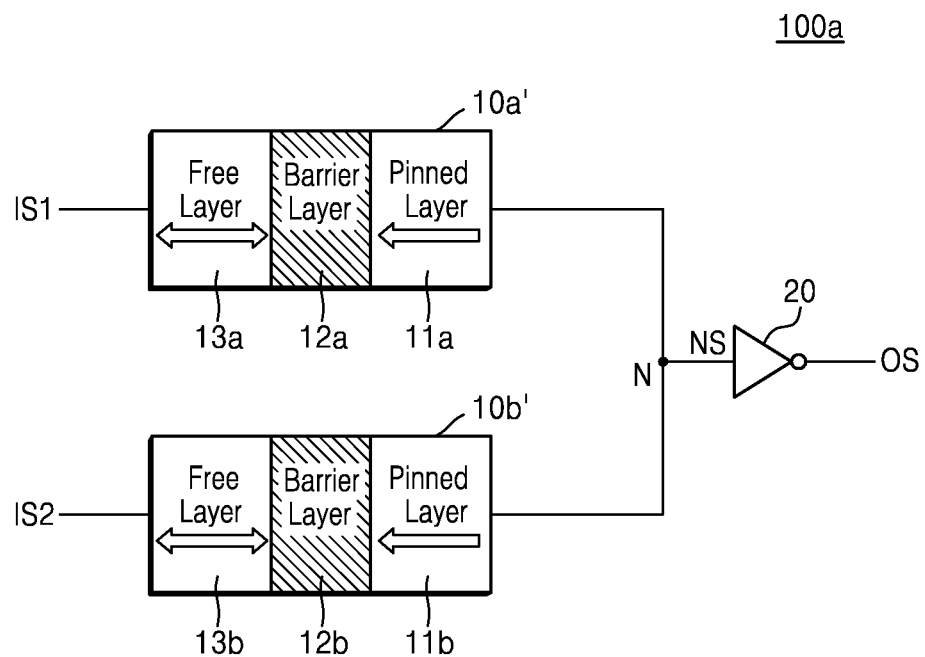
FIG. 3A is a conceptual diagram illustrating a logic circuit according to some example embodiments.
Figure 3B:
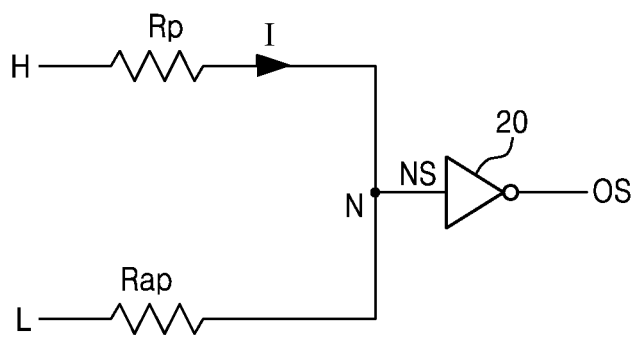
FIG. 3B is a conceptual diagram illustrating a resistance value that a magnetic tunnel junction device has when first and second input signals are respectively applied to first and second magnetic tunnel junction devices.

FIG. 3A is a conceptual diagram illustrating a logic circuit 100a according to some example embodiments. FIG. 3B is a conceptual diagram illustrating a resistance value (e.g., magnitude of electrical resistance) that a magnetic tunnel junction device has when first and second input signals are respectively applied to first and second magnetic tunnel junction devices. In FIGS. 3A and 3B, members that are the same as those in FIGS. 2A and 2B are designated by the same reference numerals, and detailed descriptions of repeated configurations are omitted herein for simplification of description.

Referring to FIG. 3A, the logic circuit 100a may include a first magnetic tunnel junction device 10a', a second magnetic tunnel junction device 10b', and the inverter 20.

The first input signal IS1 may be transmitted to the first free layer 13a of the first magnetic tunnel junction device 10a', and the second input signal IS2 may be transmitted to the second free layer 13b of the second magnetic tunnel junction device 10b'. The first pinned layer 11a, the second pinned layer 11b, and the inverter 20 may be connected to one another at the node N. The inverter 20 may receive the node signal NS from the node N and generate the output signal OS. Each of the node signal NS and the output signal OS may be an electrical signal having signal voltage.

Each of the first input signal IS1 and the second input signal IS2 may have the first logic level L (e.g., a first voltage magnitude) or the second logic level H (e.g., a second voltage magnitude). The second logic level H (e.g., second voltage magnitude) may have a value (voltage magnitude) greater than that of the first logic level L (e.g., first voltage magnitude).

TABLE 2

| IS1 | IS2 | NS | OS |
|-----|-----|----|----|
| L | L | L | H |
| H | L | >L + 0.5*(H − L) | L |
| L | H | >L + 0.5*(H − L) | L |
| H | H | H | L |

As shown in Table 2, when both of the first input signal IS1 and the second input signal IS2 have the first logic level L, no current flows through the first magnetic tunnel junction device 10a' and the second magnetic tunnel junction device 10b', and thus, the node signal NS transmitted from the node N to the inverter 20 may also have the same first logic level L as the first input signal IS1 and the second input signal IS2. Similarly, when the first input signal IS1 and the second input signal IS2 have the second logic level H, no current flows through the first magnetic tunnel junction device 10a' and the second magnetic tunnel junction device 10b', and thus, the node signal NS may have the second logic level H.

On the other hand, referring to FIG. 3B, when the first input signal IS1 has the second logic level H, and the second input signal IS2 has the first logic level L, a current may flow from the first free layer 13a to the first pinned layer 11a, and a current may flow from the second pinned layer 11b to the second free layer 13b. Accordingly, as shown in FIG. 3B, the first magnetic tunnel junction device 10a' may have a value of the parallel resistance Rp, and the second magnetic tunnel junction device 10b' may have a value of the anti-parallel resistance Rap.

A value of the node signal NS (e.g., magnitude and/or polarity of the voltage of the node signal NS) is as defined in Equation 2 below, where L and H are the voltage magnitudes corresponding to the first and second logic levels, respectively.

$$NS = L + (H - L) \times \frac{R_{ap}}{R_p + R_{ap}}$$ [Equation 2]

The anti-parallel resistance Rap has a value (e.g., electrical resistance) greater than that of the parallel resistance Rp, and accordingly, the node signal NS may have a value (e.g., voltage magnitude) closer to the second logic level H than the first logic level L. When the node signal NS is included in a sensing margin of the second logic level H of the inverter 20 (e.g., the node signal NS has a voltage magnitude that is within a "sensing margin" range of the voltage magnitude corresponding to the second logic level H), the inverter 20 may generate the output signal OS of the first logic level L (e.g., an output signal OS having a voltage magnitude corresponding to the voltage magnitude of the first logic level L). The sensing margin of the inverter 20 will be described in detail later with reference to FIGS. 6A and 6B.

A case in which the first input signal IS1 has the first logic level L (e.g., the first input signal IS1 has a voltage magnitude corresponding to the first logic level L), and the second input signal IS2 has the second logic level H (e.g., the second input signal IS2 has a voltage magnitude corresponding to the second logic level H) may also have the same result as the above case in which the first input signal IS1 has the second logic level H, and the second input signal IS2 has the first logic level L. Accordingly, as in Table 2, the logic circuit 100a may be a NOR gate logic circuit.

Figure 4:
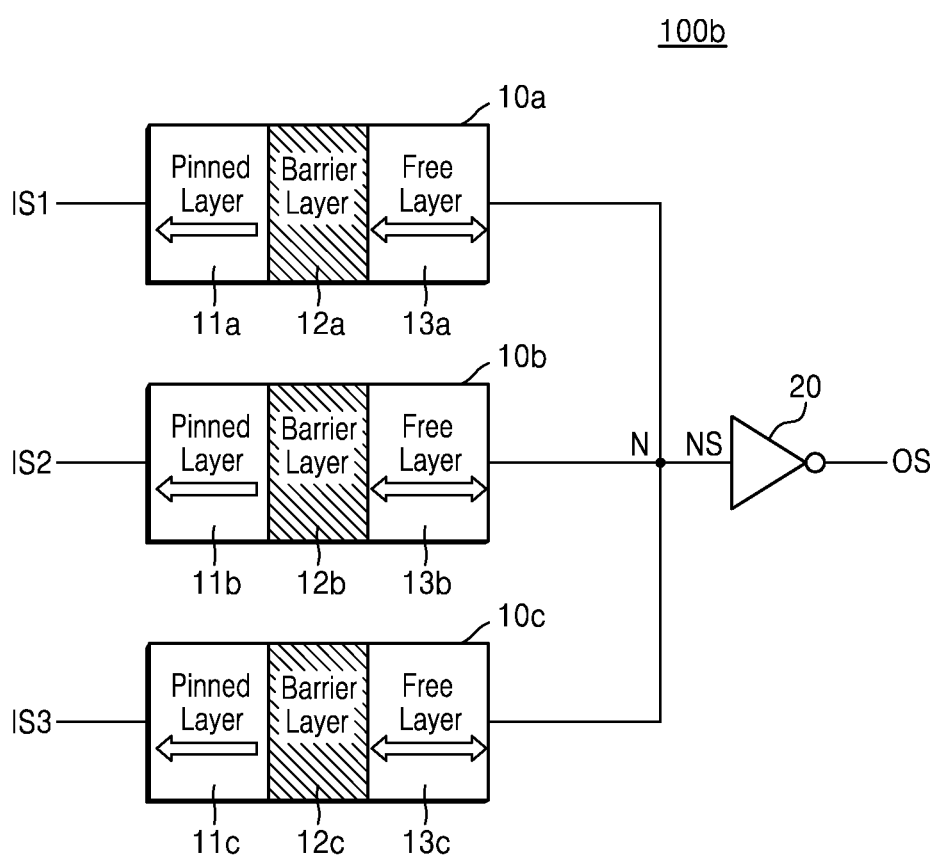
FIG. 4 is a conceptual diagram illustrating a logic circuit according to some example embodiments.

FIG. 4 is a conceptual diagram illustrating a logic circuit 100b according to some example embodiments. In FIG. 4, members that are the same as those in FIG. 2A are designated by the same reference numerals, and detailed descriptions of repeated configurations are omitted herein for simplification of description.

Referring to FIG. 4, the logic circuit 100b may include the first magnetic tunnel junction device 10a, the second magnetic tunnel junction device 10b, a third magnetic tunnel junction device 10c, and the inverter 20. The third magnetic tunnel junction device 10c may include a third free layer 13c, a third barrier layer 12c, and a third pinned layer 11c.

The first to third magnetic tunnel junction devices 10a to 10c may be the magnetic tunnel junction device 10 of FIGS. 1A and 1B. Accordingly, the third magnetic tunnel junction device 10c may have a third parallel resistance and a third anti-parallel resistance according to a current flow, values of the first to third parallel resistances may be substantially the same as one another, and values of the first to third anti-parallel resistances may be substantially the same as one another.

The first input signal IS1 may be transmitted to the first pinned layer 11a of the first magnetic tunnel junction device 10a, the second input signal IS2 may be transmitted to the second pinned layer 11b of the second magnetic tunnel junction device 10b, and a third input signal IS3 may be transmitted to the third pinned layer 11c of the third magnetic tunnel junction device 10c. The first free layer 13a, the second free layer 13b, the third free layer 13c, and the inverter 20 may be connected to one another at the node N.

Each of the first input signal IS1, the second input signal IS2, and the third input signal IS3 may have the first logic level L or the second logic level H. The second logic level H may have a value (e.g., voltage magnitude) greater than that of the first logic level L.

TABLE 3

| IS1 | IS2 | IS3 | NS | OS |
|-----|-----|-----|-----|-----|
| L | L | L | L | H |
| H | L | L | <L + 0.5*(H − L) | H |
| L | H | L | <L + 0.5*(H − L) | H |
| L | L | H | <L + 0.5*(H − L) | H |
| H | H | L | <L + 0.5*(H − L) | H |
| H | L | H | <L + 0.5*(H − L) | H |
| L | H | H | <L + 0.5*(H − L) | H |
| H | H | H | H | L |

As shown in Table 3, when all of the first to third input signals IS1 to IS3 have the first logic level L, or all of the first to third input signals IS1 to IS3 have the second logic level H, no current flows through the first to third magnetic tunnel junction devices 10a to 10c, and thus, the node signal NS transmitted from the node N to the inverter 20 may also have the same logic level as the first to third input signals IS1 to IS3.

On the other hand, when the first input signal IS1 has the second logic level H, and the second input signal IS2 and the third input signal IS3 have the first logic level L, current may flow from the first magnetic tunnel junction device 10a to the second magnetic tunnel junction device 10b and the third magnetic tunnel junction device 10c due to a potential difference. Accordingly, the first magnetic tunnel junction device 10a may have a value of the anti-parallel resistance Rap, and the second magnetic tunnel junction device 10b and the third magnetic tunnel junction device 10c may have a value of the parallel resistance Rp.

Here, a value (e.g., voltage magnitude and/or polarity) of the node signal NS is as defined in Equation 3 below, where L and H are the voltage magnitudes corresponding to the first and second logic levels, respectively.

$$NS = L + (H - L) \times \frac{R_p/2}{R_p/2 + R_{ap}}$$ [Equation 3]

The anti-parallel resistance Rap has a value (e.g., magnitude of electrical resistance) greater than that of the parallel resistance Rp, and thus, the node signal NS may have a value (e.g., voltage magnitude) closer to the first logic level L than the second logic level H. When the node signal NS is included in a sensing margin of the first logic level L of the inverter 20, the output signal OS may have the second logic level H based on the inverter 20. The sensing margin of the inverter 20 will be described in detail later with reference to FIGS. 6A and 6B.

Cases in which one of the first to third input signals IS1 to IS3 has the second logic level H, and the other two have the first logic level L may all have the same result of the output signal OS.

In addition, when the first input signal IS1 and the second input signal IS2 have the second logic level H, and the third input signal IS3 has the first logic level L, current may flow from the first magnetic tunnel junction device 10a and the second magnetic tunnel junction device 10b to the third magnetic tunnel junction device 10c due to a potential difference. Accordingly, the first magnetic tunnel junction device 10a and the second magnetic tunnel junction device 10b may have a value of the anti-parallel resistance Rap, and the third magnetic tunnel junction device 10c may have a value of the parallel resistance Rp.

Here, a value of the node signal NS is as defined in Equation 4 below, where L and H are the voltage magnitudes corresponding to the first and second logic levels, respectively.

$$NS = L + (H - L) \times \frac{R_p}{R_p + R_{ap}/2}$$ [Equation 4]

When a half of the anti-parallel resistance Rap has a value (e.g., electrical resistance) greater than that of the parallel resistance Rp, the node signal NS may have a value closer to the first logic level L than the second logic level H. When the node signal NS is included in a sensing margin of the first logic level L of the inverter 20, the output signal NS may have the second logic level H due to the inverter 20.

Cases in which two of the first to third input signals IS1 to IS3 have the second logic level H, and the other one has the first logic level L may all have the same result of the output signal OS. Accordingly, as in Table 3, the logic circuit 100b may be a NAND gate logic circuit. However, the present disclosure is not limited to the first to third input signals IS1 to IS3 being respectively inputted to the first to third magnetic tunnel junction devices 10a to 10c, and additionally, at least one magnetic tunnel junction device may be connected to the node N, and at least one input signal may be inputted to the at least one magnetic tunnel junction device.

Figure 5:
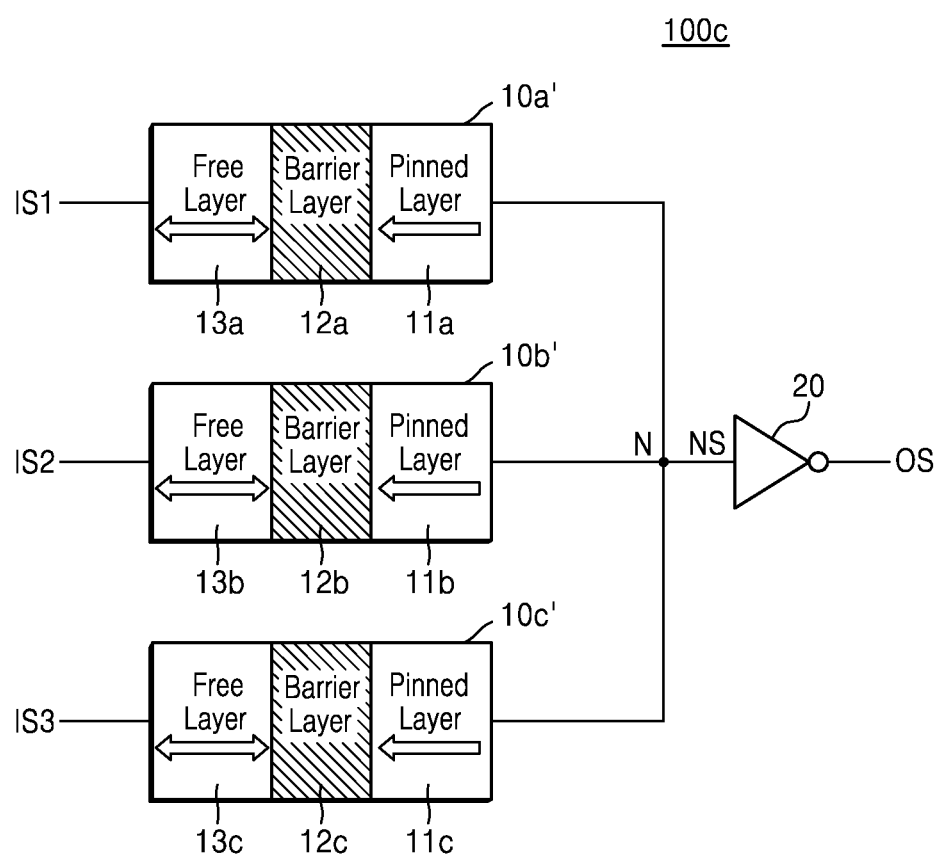
FIG. 5 is a conceptual diagram illustrating a logic circuit according to some example embodiments.

FIG. 5 is a conceptual diagram illustrating a logic circuit 100c according to some example embodiments. In FIG. 5, members that are the same as those in FIGS. 3A and 4 are designated by the same reference numerals, and detailed descriptions of repeated configurations are omitted herein for simplification of description.

Referring to FIG. 5, the logic circuit 100c may include a first magnetic tunnel junction device 10a', a second magnetic tunnel junction device 10b', a third magnetic tunnel junction device 10c', and the inverter 20.

The first input signal IS1 may be transmitted to the first free layer 13a of the first magnetic tunnel junction device 10a', the second input signal IS2 may be transmitted to the second free layer 13b of the second magnetic tunnel junction device 10b', and the third input signal IS3 may be transmitted to the third free layer 13c of the third magnetic tunnel junction device 10c'. The first pinned layer 11a, the second pinned layer 11b, the third pinned layer 11c, and the inverter 20 may be connected to one another at the node N.

TABLE 4

| IS1 | IS2 | IS3 | NS | OS |
|-----|-----|-----|-----|-----|
| L | L | L | L | H |
| H | L | L | >L + 0.5*(H − L) | L |
| L | H | L | >L + 0.5*(H − L) | L |
| L | L | H | >L + 0.5*(H − L) | L |
| H | H | L | >L + 0.5*(H − L) | L |
| H | L | H | >L + 0.5*(H − L) | L |
| L | H | H | >L + 0.5*(H − L) | L |
| H | H | H | H | L |

As shown in Table 4, when all of the first to third input signals IS1 to IS3 have the first logic level L, or all of the first to third input signals IS1 to IS3 have the second logic level H, no current flows through the first to third magnetic tunnel junction devices 10a' to 10c', and thus, the node signal NS transmitted from the node N to the inverter 20 may also have the same logic level as the first to third input signals IS1 to IS3.

On the other hand, when the first input signal IS1 has the second logic level H, and the second input signal IS2 and the third input signal IS3 have the first logic level L, current may flow from the first magnetic tunnel junction device 10a' to the second magnetic tunnel junction device 10b' and the third magnetic tunnel junction device 10c' due to a potential difference. Accordingly, the first magnetic tunnel junction device 10a' may have a value of the parallel resistance Rp, and the second magnetic tunnel junction device 10b' and the third magnetic tunnel junction device 10c' may have a value of the anti-parallel resistance Rap.

Here, a value of the node signal NS is as defined in Equation 5 below, where L and H are the voltage magnitudes corresponding to the first and second logic levels, respectively.

$$NS = L + (H - L) \times \frac{R_{ap}/2}{R_p + R_{ap}/2}$$ [Equation 5]

When a half of the anti-parallel resistance Rap has a value greater than that of the parallel resistance Rp, the node signal NS may have a value closer to the second logic level H than the first logic level L. When the node signal NS is included in a sensing margin of the second logic level H of the inverter 20, the output signal OS may have the first logic level L due to the inverter 20. The sensing margin of the inverter 20 will be described in detail later with reference to FIGS. 6A and 6B.

Cases in which one of the first to third input signals IS1 to IS3 has the second logic level H, and the other two have the first logic level L may all have the same result of the output signal OS.

In addition, when the first input signal IS1 and the second input signal IS2 have the second logic level H, and the third input signal IS3 has the first logic level L, current may flow from the first magnetic tunnel junction device 10a' and the second magnetic tunnel junction device 10b' to the third magnetic tunnel junction device 10c' due to a potential difference. Accordingly, the first magnetic tunnel junction device 10a' and the second magnetic tunnel junction device 10b' may have a value of the parallel resistance Rp, and the third magnetic tunnel junction device 10c' may have a value of the anti-parallel resistance Rap.

Here, a value of the node signal NS is as defined in Equation 6 below, where L and H are the voltage magnitudes corresponding to the first and second logic levels, respectively.

$$NS = L + (H - L) \times \frac{R_{ap}}{R_p/2 + R_{ap}}$$ [Equation 6]

The anti-parallel resistance Rap is greater than the parallel resistance Rp, and thus, the node signal NS may have a value closer to the second logic level H than the first logic level L. When the node signal NS is included in a sensing margin of the second logic level H of the inverter 20, the output signal OS may have the first logic level L due to the inverter 20.

Cases in which two of the first to third input signals IS1 to IS3 have the second logic level H, and the other one has the first logic level L may all have the same result of the output signal OS. Accordingly, as in Table 4, the logic circuit 100c may be a NOR gate logic circuit. However, the present disclosure is not limited to the first to third input signals IS1 to IS3 being respectively inputted to the first to third magnetic tunnel junction devices 10a' to 10c', and additionally, at least one magnetic tunnel junction device may be connected to the node N, and at least one input signal may be inputted to the at least one magnetic tunnel junction device.

Figure 6A:
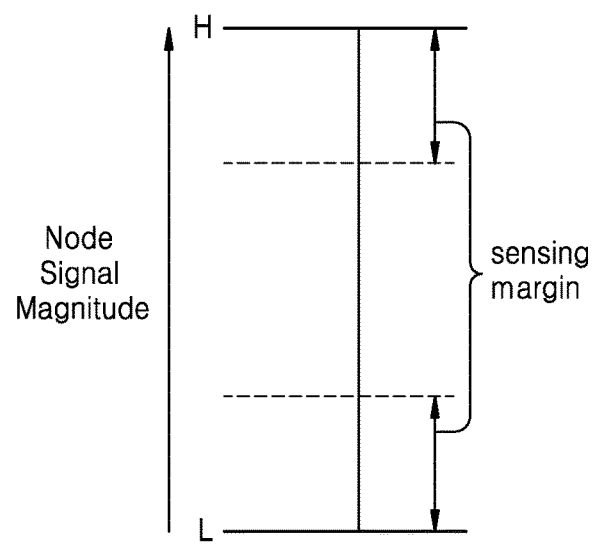
FIG. 6A is a diagram illustrating a sensing margin of an inverter included in a logic circuit according to some example embodiments.
Figure 6B:
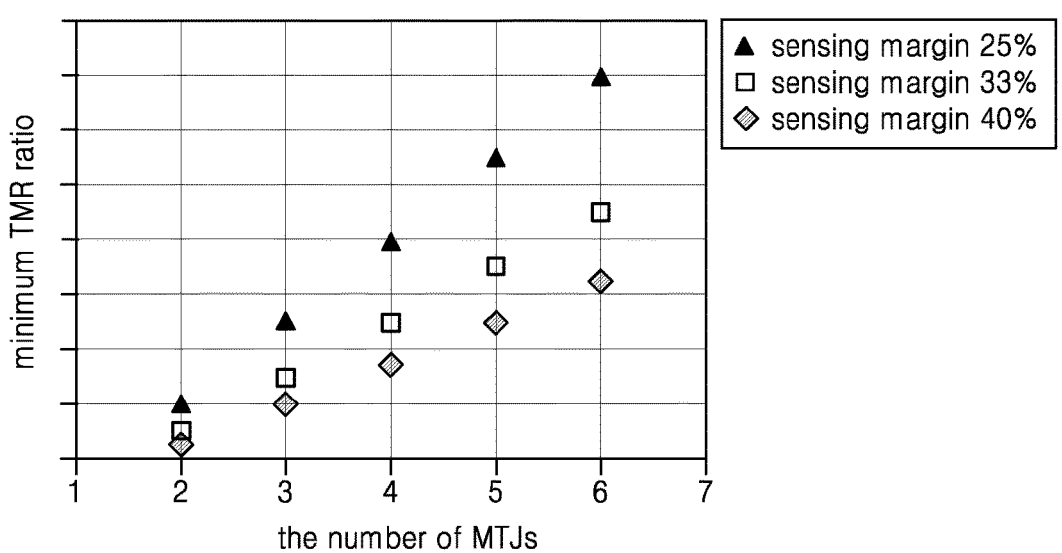
FIG. 6B is a graph showing a rate of anti-parallel resistance to parallel resistance required for a logic circuit according to some example embodiments to operate, according to the number of magnetic tunnel junction devices connected to a node.

FIG. 6A is a diagram illustrating a sensing margin of an inverter included in a logic circuit according to some example embodiments. FIG. 6B is a graph showing a tunneling magnetoresistance ratio (TMR ratio) required for a logic circuit according to some example embodiments to operate, according to the number of magnetic tunnel junction devices connected to a node.

Referring to FIGS. 2A, 3A, 4, 5, 6A and 6B, the inverter 20 may generate the output signal OS inverted in response to the node signal NS transmitted from the node N to the inverter 20. Here, in order for the inverter 20 to perform an inverting operation, the node signal NS inputted to the inverter 20 has to have a logic level (e.g., voltage magnitude) within a sensing margin of the inverter 20, where a sensing margin is a range of voltage magnitude values extending from at least one of the first logic level L or the second logic level H. When the node signal NS has a voltage magnitude within a sensing margin of the voltage magnitude corresponding to the first logic level L is inputted to the inverter 20, the inverter 20 may generate the output signal OS having a voltage magnitude corresponding to the second logic level H, and when the node signal NS has a voltage magnitude within a sensing margin of the voltage magnitude corresponding to the second logic level H is inputted to the inverter 20, the inverter 20 may generate the output signal OS having a voltage magnitude corresponding to the first logic level L.

In some example embodiments, if and/or when the number ("quantity") of magnetic tunnel junction devices connected to the node N is the same (e.g., remains constant over time), when the above Equations 1 to 6 are taken into account, as a sensing margin of the inverter 20 increases, a minimum TMR ratio required for the logic circuits 100, 100*a*, 100*b*, and 100*c* to normally operate may decrease. That is, as the sensing margin of the inverter 20 increases, TMR rate requirements of the plurality of magnetic tunnel junction devices 10*a*, 10*b*, and 10*c* included in the logic circuits 100, 100*a*, 100*b*, and 100*c* may be relaxed.

In some example embodiments, if and/or when the number of magnetic tunnel junction devices connected to the node N increases over time, the effect may be similar to example embodiments where at least one parallel resistance Rp and at least one anti-parallel resistance Rap are respectively connected to each other in parallel. As a plurality of resistances are connected to each other in parallel and in increasing quantity, the total resistance may decrease, and accordingly, a minimum TMR ratio associated with the logic circuit normally operating as a NAND gate logic circuit or a NOR gate logic circuit may increase.

For example, when Equation 1 and Equation 4 are compared with each other, in order for the logic circuit 100 of FIG. 2A and the logic circuit 100*b* of FIG. 4 to operate as a NAND gate logic circuit, the node signal NS may have a value included in a sensing margin of the first logic level L. Since the node signal NS of Equation 4 has a greater value than the node signal NS of Equation 1, a minimum TMR ratio, regarding the logic circuit 100*b* of FIG. 4, to be included in the sensing margin of the first logic level L may increase compared to the logic circuit 100 of FIG. 2A. In another example, when Equation 2 and Equation 5 are compared with each other, in order for the logic circuit 100*a* of FIG. 3A and the logic circuit 100*c* of FIG. 5 to operate as a NOR gate logic circuit, the node signal NS may have a value included in a sensing margin of the second logic level H. Since the node signal NS of Equation 5 has a greater value than the node signal NS of Equation 2, a minimum TMR ratio, regarding the logic circuit 100*c* of FIG. 5, to be included in the sensing margin of the second logic level H may increase compared to the logic circuit 100*a* of FIG. 3A.

Accordingly, as the number of magnetic tunnel junction devices connected to the node N may increase, a minimum TMR ratio associated with the logic circuit normally operating may increase.

Figure 7:
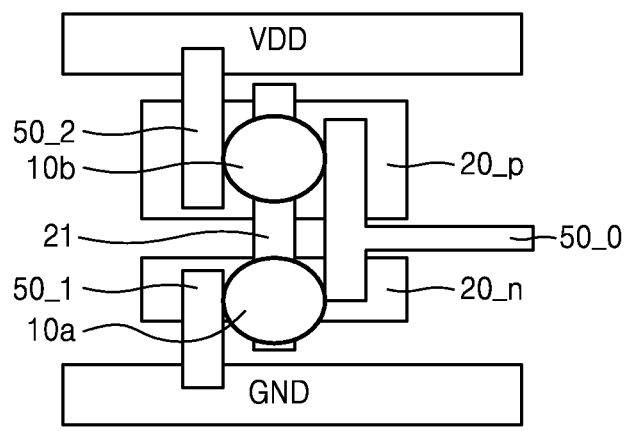
FIG. 7 is a layout illustrating a logic circuit according to some example embodiments illustrated in FIG. 2A.

FIG. 7 is a layout illustrating the logic circuit 100 according to some example embodiments illustrated in FIG. 2A.

Referring to FIG. 7, the logic circuit 100 may include the first magnetic tunnel junction device 10*a*, the second magnetic tunnel junction device 10*b*, a first active region 20_*n*, and a second active region 20_*p*. The logic circuit 100 may be the same as the logic circuit 100 of FIG. 2A. An NMOS transistor may be formed in the first active region 20_*n*, and a PMOS transistor may be formed in the second active region 20_*p*. Accordingly, the first active region 20_*n* and the second active region 20_*p* may constitute the inverter 20 of FIG. 2A. The first active region 20_*n* may be connected to a ground line GND via a first connection line 50_1, and the second active region 20_*p* may be connected to a driving voltage line VDD via a second connection line 50_2. The first active region 20_*n* and the second active region 20_*p* may be connected to an output line 50_0, and the output line 50_0 may transmit an output signal.

A gate of the NMOS transistor formed in the first active region 20_*n* and a gate of the PMOS transistor formed in the second active region 20_*p* may be connected to each other. A gate electrode 21 may be connected to the first magnetic tunnel junction device 10*a* and the second magnetic tunnel junction device 10*b*.

The first magnetic tunnel junction device 10*a* and the second magnetic tunnel junction device 10*b* may be disposed on the NMOS transistor formed in the first active region 20_*n* and the PMOS transistor formed in the second active region 20_*p*. Accordingly, compared with a CMOS NAND gate logic circuit including two NMOS transistors and two PMOS transistors, the logic circuit 100 may have the first magnetic tunnel junction device 10*a* and the second magnetic tunnel junction device 10*b* vertically formed on the NMOS transistor and the PMOS transistor, thereby decreasing an area of the logic circuit 100. Thus, integration density associated with a logic circuit 100 may be increased. Such increased density may enable high-capacity processing in a smaller area and/or volume of an electronic device. As a result, electronic devices including the logic circuit may have improved integration density and/or processing density.

However, descriptions of FIG. 7 are not limited to the logic circuit 100 of FIG. 2A only, and the logic circuits 100*a*, 100*b*, and 100*c* of FIGS. 3A, 4, and 5 may also be configured such that a plurality of magnetic tunnel junction devices are formed on an NMOS transistor and a PMOS transistor formed on a substrate, and thus, an area of the logic circuits 100*a*, 100*b*, and 100*c* may decrease.

Figure 8:
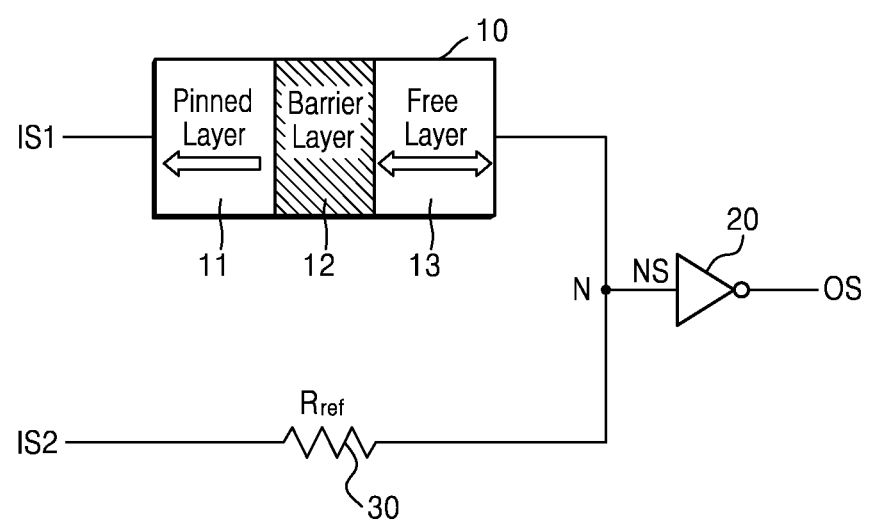
FIG. 8 is a conceptual diagram illustrating a logic circuit according to some example embodiments.

FIG. 8 is a conceptual diagram illustrating a logic circuit 100*d* according to some example embodiments. In FIG. 8, members that are the same as those in FIG. 2A are designated by the same reference numerals, and detailed descriptions of repeated configurations are omitted herein for simplification of description.

Referring to FIG. 8, the logic circuit 100*d* may include the magnetic tunnel junction device 10, a reference electrical resistance (also referred to herein as a reference resistance 30), and the inverter 20. The magnetic tunnel junction device 10 may include the free layer 13, the barrier layer 12, and the pinned layer 11.

The magnetic tunnel junction device 10 may be the magnetic tunnel junction device 10 of FIGS. 1A and 1B. Accordingly, the magnetic tunnel junction device 10 may have values of the parallel resistance Rp and the anti-parallel resistance Rap respectively according to current flow.

The first input signal IS1 may be transmitted to the pinned layer 11 of the magnetic tunnel junction device 10, and the second input signal IS2 may be transmitted to the reference resistance 30. The free layer 13, the reference resistance 30, and the inverter 20 may be connected to one another at the node N. The inverter 20 may receive the node signal NS from the node N and generate the output signal OS.

The reference resistance 30, in some example embodiments, includes a reference resistor that has a resistance corresponding to the reference resistance 30. Such a reference resistor may be referred to herein as "reference resistor 30." A value Rref of the reference resistance 30 may have a value between the parallel resistance Rp and the anti-parallel resistance Rap of the magnetic tunnel junction device 10. For example, the value Rref of the reference resistance 30 may be substantially the same as an intermediate value of the parallel resistance Rp and the anti-parallel resistance Rap of the magnetic tunnel junction device 10. However, the present disclosure is not limited thereto.

When both of the first input signal IS1 and the second input signal IS2 have the first logic level L or the second logic level H, no current flows through the magnetic tunnel junction device 10 and the reference resistance 30, and thus, the node signal NS transmitted from the node N to the inverter 20 may also have the same logic level as the first input signal IS1 and the second input signal IS2.

On the other hand, when the first input signal IS1 has the second logic level H, and the second input signal IS2 has the first logic level L, current may flow from the magnetic tunnel junction device 10 to the reference resistance 30 due to a potential difference. Here, the magnetic tunnel junction device 10 may have a value of the anti-parallel resistance Rap.

When the value Rref of the reference resistance 30 is substantially the same as the intermediate value of the parallel resistance Rp and the anti-parallel resistance Rap of the magnetic tunnel junction device 10, the node signal NS may have a value closer to the first logic level L than the second logic level H. When the node signal NS is included in a sensing margin of the first logic level L of the inverter 20, the output signal OS may have the second logic level H due to the inverter 20.

A case where the first input signal IS1 has the first logic level L, and the second input signal IS2 has the second logic level H may also have the same result as the above case where the first input signal IS1 has the second logic level H, and the second input signal IS2 has the first logic level L. Accordingly, when the first input signal IS1 and the second input signal IS2 are transmitted to the logic circuit 100d, a result similar to that shown in Table 1 may be obtained, and the logic circuit 100d may be a NAND gate logic circuit. Like the logic circuit 100 of FIG. 8, the logic circuit 100d may include first and second transistors where the inverter 20 is formed on a substrate and may have the magnetic tunnel junction device 10 disposed on the inverter 20 to decrease an area of the logic circuit 100d.

Figure 9:
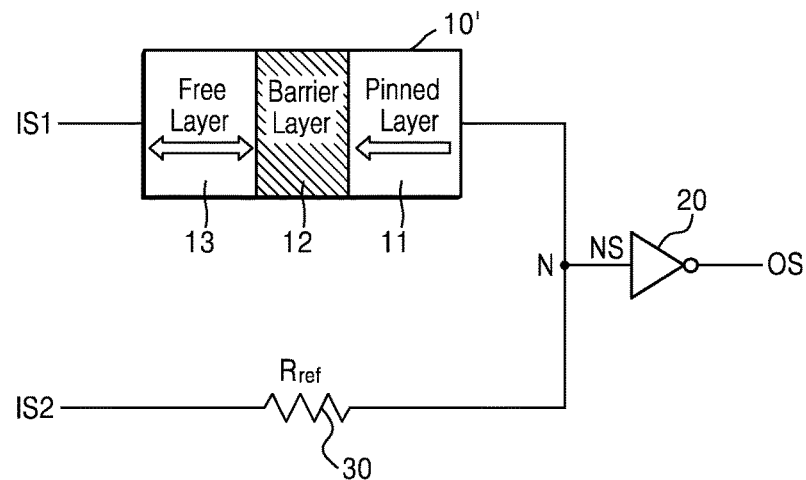
FIG. 9 is a conceptual diagram illustrating a logic circuit according to some example embodiments.

FIG. 9 is a conceptual diagram illustrating a logic circuit 100e according to some example embodiments. In FIG. 9, members that are the same as those in FIGS. 3A and 8 are designated by the same reference numerals, and detailed descriptions of repeated configurations are omitted herein for simplification of description.

Referring to FIG. 9, the logic circuit 100e may include a magnetic tunnel junction device 10', the reference resistance 30, and the inverter 20. The first input signal IS1 may be transmitted to the free layer 13 of the magnetic tunnel junction device 10'. The pinned layer 11, the reference resistance 30, and the inverter 20 may be connected to one another at the node N.

When both of the first input signal IS1 and the second input signal IS2 have the first logic level L or the second logic level H, no current flows through the magnetic tunnel junction device 10' and the reference resistance 30, and thus, the node signal NS transmitted from the node N to the inverter 20 may also have the same logic level as the first input signal IS1 and the second input signal IS2.

On the other hand, when the first input signal IS1 has the second logic level H, and the second input signal IS2 has the first logic level L, current may flow from the magnetic tunnel junction device 10' to the reference resistance 30 due to a potential difference. Here, the magnetic tunnel junction device 10' may have a value of the parallel resistance Rp.

When the value Rref of the reference resistance 30 is substantially the same as an intermediate value of the parallel resistance Rp and the anti-parallel resistance Rap of the magnetic tunnel junction device 10', the node signal NS may have a value closer to the second logic level H than the first logic level L. When the node signal NS is included in a sensing margin of the second logic level H of the inverter 20, the output signal OS may have the first logic level L due to the inverter 20.

A case where the first input signal IS1 has the first logic level L, and the second input signal IS2 has the second logic level H may also have the same result as the above case where the first input signal IS1 has the second logic level H, and the second input signal IS2 has the first logic level L. Accordingly, when the first input signal IS1 and the second input signal IS2 are transmitted to the logic circuit 100e, a result similar to that shown in Table 2 may be obtained, and the logic circuit 100e may be a NOR gate logic circuit.

Figure 10:
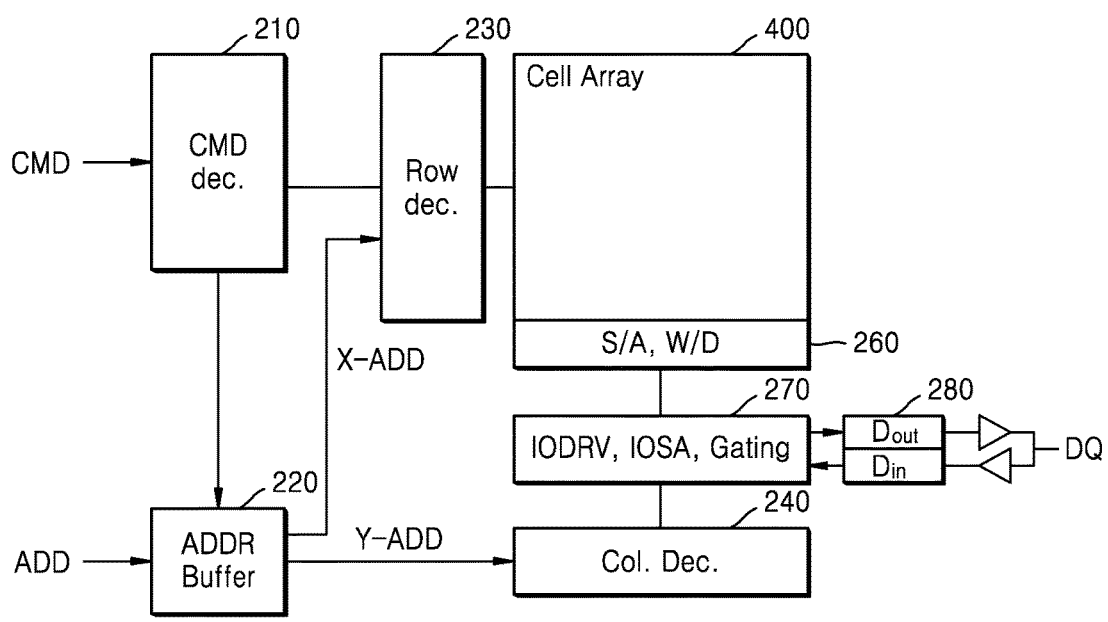
FIG. 10 is a block diagram showing a memory device including a logic circuit according to some example embodiments.

FIG. 10 is a block diagram showing a memory device 1000 including a logic circuit according to some example embodiments.

Referring to FIG. 10, the memory device 1000 may include a command decoder 210, an address buffer 220, a row decoder 230, a column decoder 240, a cell array 400, a write drive/sense amp 260, an input/output driver 270, and a data input/output device 280. The memory device 1000 may include the logic circuits 100, 100a, 100b, 100c, 100d, and 100e of FIGS. 2A, 3A, 4, 5, 8, and 9.

The command decoder 210 may receive a command signal CMD from a memory controller and perform a decoding operation. After decoding is completed, the memory device 1000 may be controlled to perform a command of the memory controller.

An address signal ADD received from the memory controller is stored in the address buffer 220. Thereafter, the address buffer 220 transmits a row address Y-ADD to the row decoder 230 and transmits a column address X-ADD to the column decoder 240.

Each of the row decoder 230 and the column decoder 240 includes a plurality of switches. The row decoder 230 may be switched in response to a row address to select a word line WL, and the column decoder 240 may be switched in response to a column address to select a bit line BL.

The cell array 400 may include a plurality of memory cells over an intersection area of the word line WL and the bit line BL, and for example, a memory cell may be a spin transfer torque magneto resistive random access memory (STT-MRAM) cell. The STT-MRAM cell may be a resistive memory cell having non-volatile characteristics. Accordingly, the STT-MRAM cell may have a relatively large or small resistance value according to written data.

When data is read, data voltages having different levels from each other according to the resistance value may be generated and be provided to the write drive/sense amp 260. The write drive/sense amp 260 may include a plurality of sense amp circuits sensing/amplifying data voltage and may output a digital-level data signal based on the data voltages. A data signal processed in the write drive/sense amp 260 may be transmitted to the data input/output device 280 through the input/output driver 270. The data input/output device 280 may output received data to the memory controller.

Figure 11:
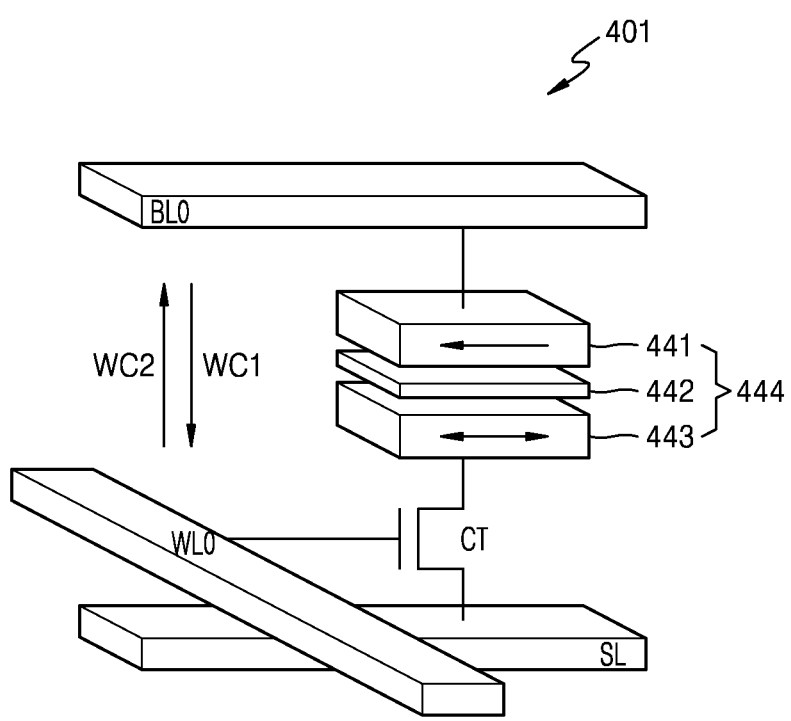
FIG. 11 is a three-dimensional diagram showing an implementation example of STT-MRAM as an example of a memory cell included in a cell array of FIG. 10.

FIG. 11 is a three-dimensional diagram showing an implementation example of STT-MRAM as an example of a memory cell 401 included in the cell array 400 of FIG. 10.

Referring to FIG. 11, a memory device including the logic circuits 100, 100a, 100b, 100c, 100d, and 100e of FIGS. 2A, 3A, 4, 5, 8, and 9 may be a magnetic random access memory device. The memory cell 401 may include a cell magnetic tunnel junction device 444 and a cell transistor CT. A gate of the cell transistor CT may be connected to a word line, for example, a first word line WL0, and one electrode of the cell transistor CT may be connected to a bit line, for example, a first bit line BL0, via the cell magnetic tunnel junction device 444. Also, the other electrode of the cell transistor CT may be connected to a source line SL.

The cell magnetic tunnel junction device 444 may include a pinned layer 441, a free layer 443, and a barrier layer 442 therebetween. Although the cell magnetic tunnel junction device 444 may be the magnetic tunnel junction device 10 of FIGS. 1A and 1B, the present disclosure is not limited thereto.

In order to perform a write operation of the STT-MRAM, the cell transistor CT may be turned on by applying a voltage of logic high to the word line WL0, and write currents WC1 and WC2 may be applied between the bit line BL0 and the source line SL.

In order to perform a read operation of the STT-MRAM, the cell transistor CT may be turned on by applying a voltage of logic high to the word line WL0, and a read current may be applied in a direction from the bit line BL0 to the source line SL. Thus, data stored in the cell magnetic tunnel junction device 444 may be determined according to a measured resistance value.

Figure 12:
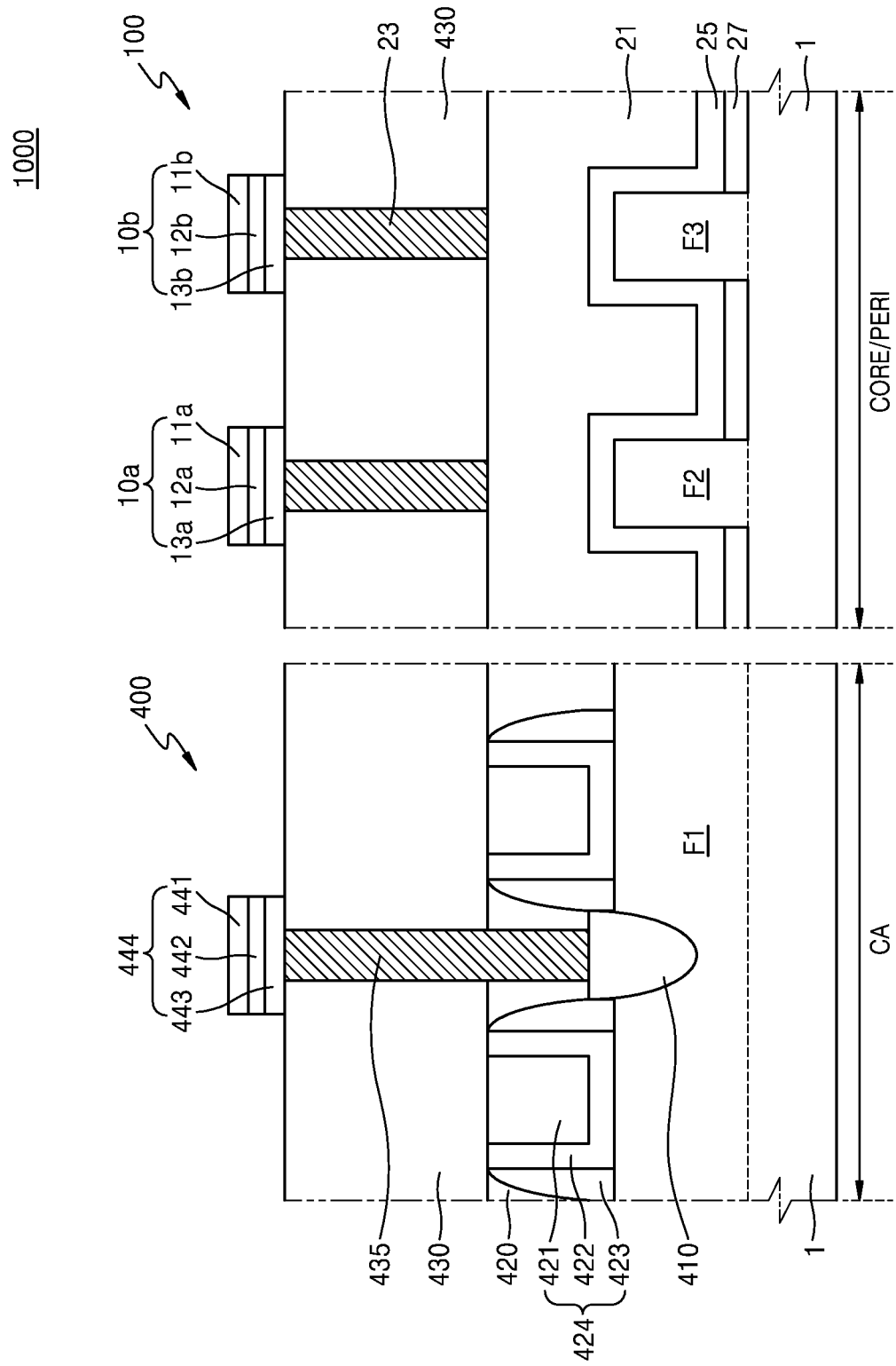
FIG. 12 is a cross-sectional view showing a memory device including a logic circuit according to some example embodiments illustrated in FIG. 2A.

FIG. 12 is a cross-sectional view showing the memory device 1000 including the logic circuit 100 according to some example embodiments illustrated in FIG. 2A. In FIG. 12, members that are the same as those in FIGS. 7 and 11 are designated by the same reference numerals, and detailed descriptions of repeated configurations are omitted herein for simplification of description.

Referring to FIG. 12, the memory device 1000 may be divided into a cell array region CA and a peripheral circuit region CORE/PERI. Although the cell array region CA is shown as disposed on the left, and the peripheral circuit region CORE/PERI is shown as disposed on an outer side of the cell array region CA, the present disclosure is not limited thereto. In some example embodiments, the cell array region CA may be located in a first portion of the memory device and the peripheral circuit region CORE/PERI may be located in a second portion of the memory device, where the second portion may extend at least partially around an outer boundary of the first portion. For example, the cell array region CA may be surrounded by the peripheral circuit region CORE/PERI. A plurality of memory cells may be arranged in the cell array region CA, and a plurality of driving circuits for driving the plurality of memory cells may be arranged in the peripheral circuit region CORE/PERI. The cell array region CA is a cross-section taken along a first fin F1 of the substrate 1, and the peripheral circuit region CORE/PERI is a cross-section taken along the gate electrode 21 of FIG. 7. In some example embodiments, the first fin F1 (also referred to herein as a first fin structure) may include an active region of the substrate 1.

The cell array region CA may include a substrate 1, a cell gate structure 424, a source/drain region 410, first and second interlayer insulation layers 420 and 430, a contact 435, and the cell magnetic tunnel junction device 444. In detail, the substrate 1 may include one or more semiconductor materials selected from the group including Si, Ge, SiGe, GaP, GaAs, SiC, SiGeC, InAs, and InP. In addition, the substrate 1 may be a silicon-on-insulator (SOI) substrate.

The first fin F1 may be a portion of the substrate 1 and may include an epitaxial layer grown from the substrate 1. The first fin F1 may include, for example, Si or SiGe.

The cell gate structure 424, the source/drain region 410, and the first fin F1 may constitute the cell transistor CT of FIG. 11.

The cell gate structure 424 may include a cell gate electrode 421, a cell gate insulation layer 422, and a spacer 423. The cell gate insulation layer 422 may include a high-k material having a higher dielectric constant than a silicon oxide layer. For example, the cell gate insulation layer 422 may include $HfO_2$, $ZrO_2$, LaO, $Al_2O_3$, or $Ta_2O_5$. The cell gate electrode 421 may include at least one of TiN, TaN, TiC, TiAlC, and TaC, or the cell gate electrode 421 may include W or Al. The cell gate electrode 421 may include Si, SiGe, etc. instead of metal. The spacer 423 may include, for example, at least one of an oxide layer, a nitride layer, and an oxynitride layer, and unlike illustrated in FIG. 12, the cell gate electrode 421 and the spacer 423 may include a plurality of layers stacked on each other instead of a single layer.

The source/drain region 410 may be disposed on both sides of the cell gate structure 424. The source/drain region 410 may be disposed in the first fin F1. The source/drain region 410 may be formed by epitaxial growth.

The first and second interlayer insulation layers 420 and 430 may be sequentially formed. The first interlayer insulation layer 420 may cover a side wall of the spacer 423 and may cover a portion of a side wall of the contact 435. The second interlayer insulation layer 430 may cover the rest of the side wall of the contact 435. The first and second interlayer insulation layers 420 and 430 may include at least one of an oxide layer, a nitride layer, and an oxynitride layer. The contact 435 may penetrate the first and second interlayer insulation layers 420 and 430 and connect the source/drain region 410 and the cell magnetic tunnel junction device 444 to each other.

The peripheral circuit region CORE/PERI may include the substrate 1, second and third fins F2 and F3 of the substrate 1 (also referred to herein as a second fin structure and a third fin structure, respectively), a field insulation layer 27, a gate insulation layer 25, the gate electrode 21, the second interlayer insulation layer 430, a gate contact 23, and the first and second magnetic tunnel junction devices 10a and 10b.

The second and third fins F2 and F3 may be formed by the same method as the first fin F1 of the cell array region CA and may include the same material as that of the first fin F1. The field insulation layer 27 may be formed on the substrate 1 and may partially cover a side wall of the second and third fins F2 and F3 and may expose an upper portion of the second and third fins F2 and F3.

The gate insulation layer 25 and the gate electrode 21 may be formed through the same process as the cell gate insulation layer 422 and the cell gate electrode 421 to include the same material as that of the cell gate insulation layer 422 and the cell gate electrode 421. However, the present disclosure is not limited thereto, and the gate insulation layer 25 and the gate electrode 21 may be formed by an individual process. In some example embodiments, the second fin F2 and the third fin F3 may include one or more separate active regions of the substrate 1. For example, the second fin F2 may be the first active region 20_n of FIG. 7, and the second fin F2, the gate insulation layer 25, and the gate electrode 21 may constitute a transistor. In another example, the third fin F3 may be the second active region 20_p of FIG. 7, and the third fin F3, the gate insulation layer 25, and the gate electrode 21 may constitute a transistor. For example, the second fin F2, the gate insulation layer 25, and the gate electrode 21 may constitute an NMOS transistor, and the third fin F3, the gate insulation layer 25, and the gate electrode 21 may constitute a PMOS transistor.

The first and second magnetic tunnel junction devices 10a and 10b may be formed on the second interlayer insulation layer 430. Here, the gate contact 23 may penetrate the second interlayer insulation layer 430 and connect the gate electrode 21 and the first and second magnetic tunnel junction devices 10a and 10b to each other.

The cell magnetic tunnel junction device 444 of the cell array region CA and the first and second magnetic tunnel junction devices 10a and 10b of the peripheral circuit region CORE/PERI may be formed on the second interlayer insulation layer 430 by using the same mask through the same process. That is, without an additional process during formation of the cell array 400 in the cell array region CA, the logic circuit 100 may be formed in the peripheral circuit region CORE/PERI, and accordingly, cost of forming the logic circuit 100 may be saved.

However, descriptions of FIG. 12 are not limited to a memory device including the logic circuit 100 of FIG. 2A and may be applied to a memory device including the logic circuits 100a, 100b, 100c, 100d, and 100e of FIGS. 3A, 4, 5, 8, and 9. Also, although it is illustrated in FIG. 12 that the cell transistor CT over the substrate 1 and the transistors in the peripheral circuit region CORE/PERI are FinFETs, the present disclosure is not limited thereto, and they may be formed of various types.

As shown in FIG. 12, the magnetic tunnel junction devices 444, 10a, 10b are on an upper portion (e.g., an upper surface) of the transistors implemented by the cell gate structure 424, the source/drain region 410, and the first fin F1; the second fin F2, the gate insulation layer 25, and the gate electrode 21; and the third fin F3, the gate insulation layer 25, and the gate electrode 21, respectively.

In some example embodiments, a logic device includes a reference resistor that is on the transistor. For example, reference resistor 30 may be on an interlayer insulation layer 430 and may be connected to the transistor via a contact (e.g., contact 435 and/or contact 23).

Figure 13:
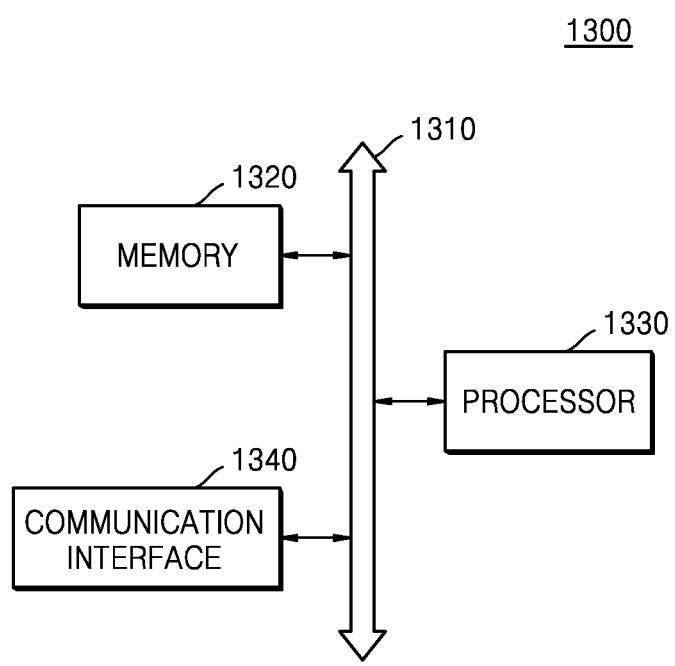
FIG. 13 is a diagram illustrating an electronic device 1300 according to some example embodiments.

FIG. 13 is a diagram illustrating an electronic device 1300 according to some example embodiments.

Referring to FIG. 13, the electronic device 1300 includes a memory 1320, a processor 1330, and a communication interface 1340.

The electronic device 1300 may be included in one or more various electronic devices. In some example embodiments, the electronic device 1300 may include a computing device. A computing device may include a personal computer (PC), a tablet computer, a laptop computer, a netbook, some combination thereof, or the like. The memory 1320, the processor 1330, and the communication interface 1340 may communicate with one another through a bus 1310.

The communication interface 1340 may communicate data from an external device using various Internet protocols. The external device may include, for example, a computing device.

The processor 1330 may execute a program and control the electronic device 1300. A program code to be executed by the processor 1330 may be stored in the memory 1320. An electronic system may be connected to an external device through an input/output device (not shown) and exchange data with the external device.

The memory 1320 may store information. The memory 1320 may be a volatile or a nonvolatile memory. The memory 1320 may be a non-transitory computer readable storage medium. The memory may store computer-readable instructions that, when executed, cause the execution of one or more methods, functions, processes, etc. as described herein. In some example embodiments, the processor 1330 may execute one or more of the computer-readable instructions stored at the memory 1320.

In some example embodiments, the memory 1320 may include one or more of the logic devices described herein, including the logic circuits 100a, 100b, 100c, 100d, and 100e of FIGS. 3A, 4, 5, 8, and 9. For example, memory 1320 may include the memory device 1000 shown in FIG. 11.

In some example embodiments, the communication interface 1340 may include a USB and/or HDMI interface. In some example embodiments, the communication interface 1850 may include a wireless communication interface.

In some example embodiments, an apparatus may include some or all of the elements described herein. For example, an apparatus may include the memory device 1000 described above. In another example, an apparatus may include some or all of the electronic device 1300. An apparatus may include one or more of the logic circuits described herein.

While the inventive concepts have been particularly shown and described with reference to embodiments thereof, it will be understood that various changes in form and details may be made therein without departing from the spirit and scope of the following claims.

What is claimed is:

1. A logic circuit comprising:
   a magnetic tunnel junction device including a first layer configured to receive a first input signal and a second layer connected to a node;
   a reference resistor configured to receive a second input signal, the reference resistor connected to the node, the reference resistor having a reference resistance, the reference resistance is greater than a parallel resistance of the magnetic tunnel junction device and smaller than an anti-parallel resistance of the magnetic tunnel junction device; and
   an inverter connected to the node, the inverter configured to generate an output signal based on inverting a signal of the node.

2. The logic circuit of claim 1, wherein,
   the first layer is a pinned layer,
   the second layer is a free layer, and
   the logic circuit is a NAND gate logic circuit.

3. The logic circuit of claim 1, wherein,
   the first layer is a free layer,
   the second layer is a pinned layer, and
   the logic circuit is a NOR gate logic circuit.

4. The logic circuit of claim 1, wherein,
   the inverter includes a transistor on a substrate, and
   the magnetic tunnel junction device and the reference resistor are on an upper portion of the transistor.

5. The logic circuit of claim 1, wherein the reference resistance is substantially common with an intermediate value of parallel resistance and anti-parallel resistance of the magnetic tunnel junction device.

6. The logic circuit of claim 1, wherein,
   the magnetic tunnel junction device or the reference resistor are connected to the node.

* * * * *